(12) United States Patent
Delshadpour et al.

(10) Patent No.: US 10,763,830 B2
(45) Date of Patent: Sep. 1, 2020

(54) CURRENT CONTROLLED OSCILLATOR

(71) Applicant: NXP B.V., Eindhoven (NL)

(72) Inventors: Siamak Delshadpour, Phoenix, AZ (US); Chiahung Su, San Jose, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/185,639

(22) Filed: Nov. 9, 2018

(65) Prior Publication Data

US 2020/0153416 A1 May 14, 2020

(51) Int. Cl.
*H03K 3/03* (2006.01)
*H03K 3/011* (2006.01)
*H03L 1/02* (2006.01)

(52) U.S. Cl.
CPC .......... *H03K 3/011* (2013.01); *H03K 3/0315* (2013.01); *H03L 1/022* (2013.01)

(58) Field of Classification Search
CPC ........ H03B 5/04; H03K 3/011; H03K 3/0315; H03K 3/0322; H03L 1/02; H03L 1/022
USPC .................................................. 331/57, 176
See application file for complete search history.

(56) References Cited

U.S. PATENT DOCUMENTS

| | | | |
|---|---|---|---|
| 4,547,749 A | 10/1985 | Kuo | |
| 4,851,792 A | 7/1989 | Ochiai et al. | |
| 5,886,946 A * | 3/1999 | Ooishi | G11C 5/14 365/194 |
| 6,788,159 B2 | 9/2004 | Takahashi et al. | |
| 7,701,301 B2 | 4/2010 | Lakshmikumar et al. | |
| 8,076,980 B2 | 12/2011 | Liu | |
| 8,248,171 B1 | 8/2012 | Bugbee et al. | |
| 8,436,687 B2 * | 5/2013 | Aruga | H03K 3/354 331/135 |
| 9,401,719 B2 | 7/2016 | Lesbats et al. | |
| 2006/0255868 A1 * | 11/2006 | May | H03L 7/0996 331/57 |
| 2010/0171558 A1 * | 7/2010 | Kim | H03K 3/0322 331/57 |
| 2012/0140792 A1 * | 6/2012 | Yeh | G01K 7/01 374/170 |
| 2012/0182080 A1 | 7/2012 | Sinitsky et al. | |
| 2015/0116042 A1 * | 4/2015 | Kim | H03K 3/011 331/57 |
| 2015/0137896 A1 * | 5/2015 | Gajda | H03L 1/02 331/57 |
| 2015/0214955 A1 * | 7/2015 | Calhoun | G06F 1/04 331/47 |
| 2015/0300889 A1 * | 10/2015 | Ramaraju | G01K 7/01 374/170 |
| 2019/0064007 A1 * | 2/2019 | Lesso | G01K 7/32 |

* cited by examiner

*Primary Examiner* — Levi Gannon

(57) ABSTRACT

A temperature compensated current controlled oscillator (CCO) including a first current generator configured to produce a proportional to absolute temperature (PTAT) current based upon a trim signal, a second current generator configured to produce a complementary to absolute temperature (CTAT) current based upon a temperature measurement, and a ring oscillator configured to receive the PTAT current and the CTAT current and to produce a frequency signal based upon the PTAT current and the CTAT current.

14 Claims, 4 Drawing Sheets

CURRENT CONTROLLED OSCILLATOR

TECHNICAL FIELD

Example embodiments disclosed herein relate generally to current controlled oscillators and more specifically to a 48-MHz low power precision current-controlled oscillator that may be used in universal asynchronous receiver-transmitter (UART) and universal serial bus (USB) Type C applications or any other place that a high accuracy on-chip oscillator is required.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include a temperature compensated current controlled oscillator (CCO), including a first current generator configured to produce a proportional to absolute temperature (PTAT) current based upon a trim signal, a second current generator configured to produce a complementary to absolute temperature (CTAT) current based upon a temperature measurement, and a ring oscillator configured to receive the PTAT current and the CTAT current and to produce a frequency signal based upon the PTAT current and the CTAT current.

The first current generator may include a digital to analog converter (DAC) configured to receive the trim signal and to produce an analog control signal.

The first current generator may include a current source controlled by the analog control signal.

The second current generator may include a temperature sensor to produce the temperature measurement.

The second current generator may include an analog to digital converter (ADC) configured to receive the temperature measurement signal and to produce a digital temperature control signal.

The second current generator may include a current source controlled by the digital temperature control signal.

The ICTAT current may only be produced when the temperature data is above a threshold value.

The CCO core may include a plurality of inverters to produce an oscillating frequency.

Example embodiments may also include a method of producing a frequency signal using a temperature compensated current controlled oscillator (CCO), including producing, by a first current generator, a proportional to absolute temperature (PTAT) current based upon a trim signal, producing, by a second current generator, a complementary to absolute temperature (CTAT) current based upon a temperature measurement, receiving, by a ring oscillator, the PTAT current and the CTAT current, and producing, by the ring oscillator, a frequency signal based upon the PTAT current and the CTAT current.

The method may include receiving, by a digital to analog converter (DAC), the trim signal and producing an analog control signal.

The first current generator may include a current source controlled by the analog control signal.

The method may include producing the temperature measurement by a temperature sensor.

The second current generator may be configured to receive, by an analog to digital converter (ADC), the temperature measurement signal and produce, by the ADC, a digital temperature control signal.

The second current generator may include a current source controlled by the digital temperature control signal.

The CTAT current may only be produced when the temperature data is above a threshold value.

The CCO core may include a plurality of inverters to produce an oscillating frequency.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
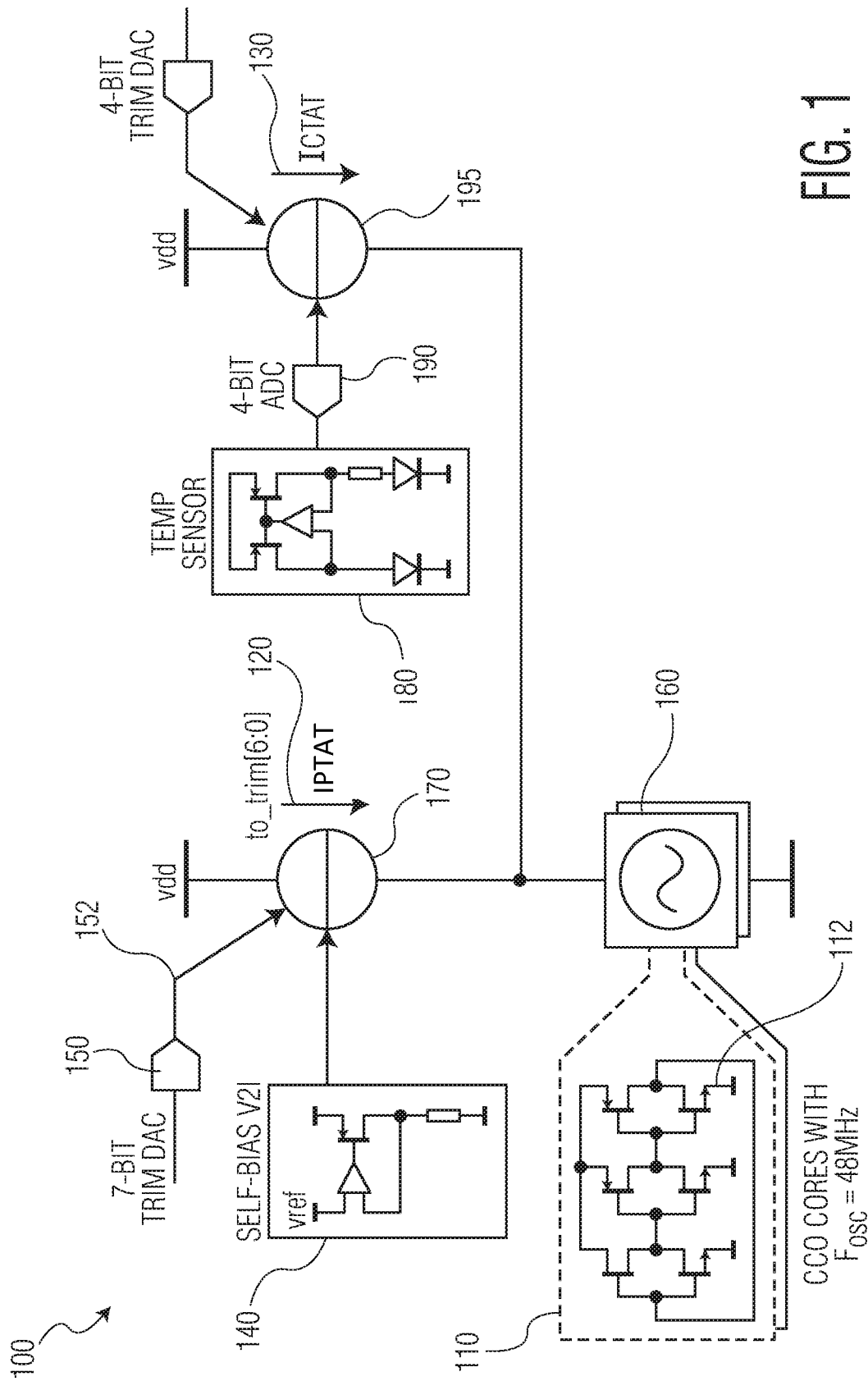
FIG. 1 illustrates a VCO Core (PTAT+CTAT current) in accordance with example embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Example embodiments include a low power precision current-controlled oscillator to meet stringent (<+/−1%) frequency variations over process, voltage, temperature (PVT). The current-controlled oscillator (CCO) may include a voltage to current converter (V2I), an inverter buffer chain configured to act as an oscillator, and a 7-bit unit element current digital to analog converter (DAC). The DAC may trim an oscillator frequency by trimming its core current. The CCO may also include a temperature sensor, secondary current DAC coming from the temperature sensor, and an analog timer to provide a clean clock for digital purposes. A simulation result illustrates that the CCO as described herein can achieve <+/−1% frequency variations across temperature, voltage and temperature.

Example embodiments include a high precision clock (+/−1% variation from silicon measurement result), low power consumption (75 uA), and fast start-up time (<15 us PVT, silicon proven).

In universal asynchronous receiver/transmitter (UART) technical specifications, an accurate timing is needed to guarantee correct data transmission. Therefore, an on-chip clock is desired to provide a reference clock within +/−3.3% variations over PVT. The reference clock may need less than +/−2% variations over PVT for an extreme case scenario. Example embodiments described herein have gone a step further and account for <+/−1% variations over PVT, which has been tested and confirmed by silicon measurement. In addition to a high accuracy requirement, a low power oscillator is included herein. Example embodiments described herein may consume only 75 uA (less than 50 uA without Temp Sensor while providing +/−3% accuracy). A temperature sensor has a benefit of higher accuracy over temperature that may not be achieved without it.

Example embodiments provide a +/−3% accuracy clock without temperature sensor, a +/−1% accuracy clock enabling temperature sensor, a high accuracy high speed clock, and a low current high accuracy.

An operating voltage of the current controlled oscillator is 1.8V+−10%, and the current consumption may be about 75 uA. Example embodiments may provide a high precision clock having <1% variation from a silicon measurement result and may include a 7-bit unit element current DAC (IDAC) to adjust oscillator frequency due to process variation of real silicon.

Example embodiments include a proportional to absolute temperature (PTAT) (approximately 970 ppm or 16% from −40° C. to 125° C.) biasing current generator. Example embodiments also include a temperature compensation (Temp Sensor) current DAC. This secondary current DAC may operate only at elevated temperature. Example embodiments include an analog timer to avoid a glitchy clock feeding into a digital cell and a simple CCO core. Also, current may be applied only as a bias current. Example embodiments result in a good high frequency clock.

FIG. 1 illustrates a current controlled oscillator (CCO) core 100 (PTAT+CTAT current) in accordance with example embodiments described herein. FIG. 1 illustrates the core oscillator 110 that may be a three-stage current controlled ring oscillator (CCO). The CCO 110 may have at least three inverters 112. The oscillator 110 may output a clock signal having a frequency Fout that is proportional to gm/C, while gm is proportional to a bias current Ibias. If gm (or C) is trimmed to compensate for a process variation, a fixed gm over voltage and temperature may output a fixed frequency after trimming (C variation over temperature and voltage is negligible).

Trimming is a function of switched capacitors, and no small switch is available while capacitors are small.

Trimming current of core gm cells (inverters 112) may be easier and more common for a low voltage and high frequency oscillator. Therefore, the current of the CCO 110 is trimmed to achieve high accuracy.

Example embodiments include the combination of a proportional to absolute temperature current 120 (PTAT) and a complementary to absolute temperature current 130 (CTAT).

PTAT core current 120 may be output from a PTAT biasing generator 140. A temperature coefficient of this PTAT current 120 may be about 970 ppm. The PTAT core current 120 may be utilized to provide reference currents a for current digital to analog converter (DAC). A one percent bandgap may provide an accurate reference voltage for the PTAT biasing generator 140.

Example embodiments include a 7-bit unit element current DAC 150 that is configured to provide core current for the ring oscillator 110. The 7-bit unit element current DAC 150 may provide trimming capability to overcome process variations, such as from component mismatches, current, or capacitor variation over process. A monotonicity of the 7-bit current DAC 150 is provided by the design.

The 7-bit current DAC 150 may be configured to trim PTAT current is Illustrated in FIG. 1. The CCO core 100 includes a PTAT current source 170 that may be a switchable current source which takes its bias from the bias generator 140. The bias generated may be shared between PTAT and CTAT current sources. The PTAT section may be programmed by trimming a frequency response obligation (FRO) frequency.

The CCO core also includes an ICTAT current source which includes a temperature sensor 180. An output of the temperature sensor 180 may be digitized using a simple 4-bit ADC 190. Output of the 4-bit ADC 190 may control a CTAT current source 195 which has its bias is taken from the same bias generator 140 of the PTAT current source. In the CTAT domain, the current source has a 4-bit accuracy in which control bits of the 4-bit ADC 190 are output from the temperature sensor 180.

The PTAT current 120 by itself does not provide a satisfactory accuracy with respect to all process conditions.

According to example embodiments, an ICTAT current 130 is able to compensate part of a frequency variation due to temperature effects on device parameters. In addition, due to the ring oscillator's 160 frequency characteristic over temperature is CTAT, the weak PTAT currents 120 injected into CTAT ring oscillator 160 will minimize oscillator's frequency variation over temperature.

Figure 2:
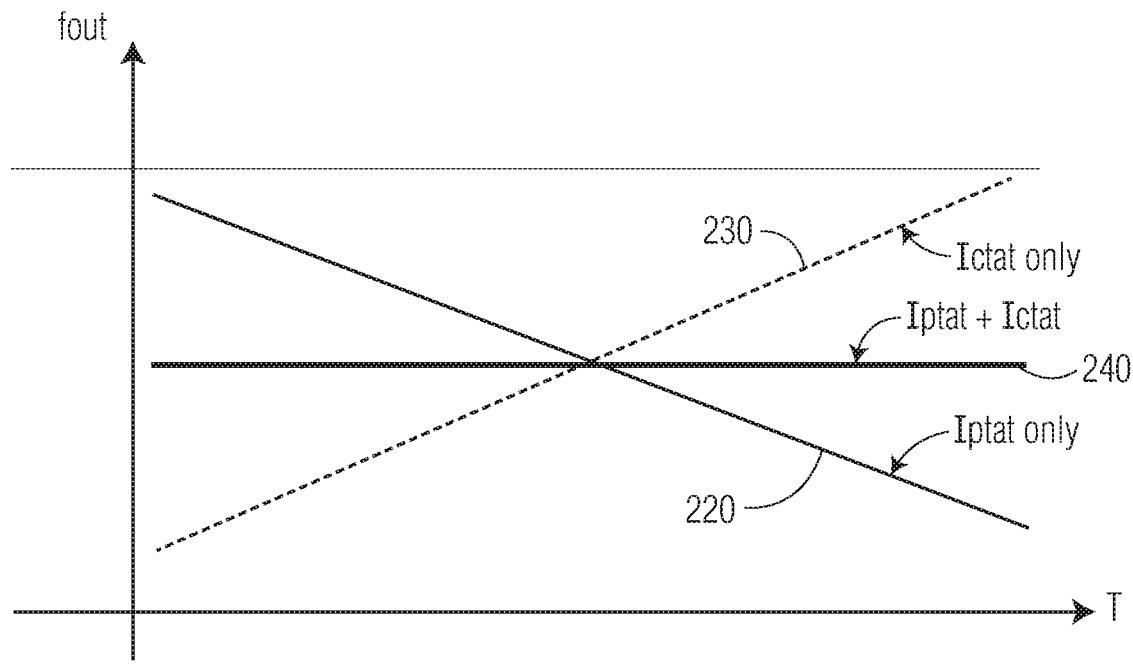
FIG. 2 illustrates Fout versus Ictat, Iptat and Iptat+Ictat for ideal PTAT and CTAT sources in accordance with example embodiments described herein.

FIG. 2 illustrates Fout versus Ictat, Iptat and Iptat+Ictat for ideal PTAT and CTAT sources in accordance with example embodiments described herein. The DC level of Iptat+Ictat has been moved for a better comparison. FIG. 2 illustrates Fout versus an ideal PTAT current 220, a CTAT current 230 and a summation 240 of the two which makes Fout a fixed frequency. Based on FIG. 2, an, ideal frequency will be as follow:

$$Fout=f0-a*T(PTAT\ only)$$

$$Fout=f0+b*T(CTAT\ only)$$

$$Fout=f0+(b-a)*T(PTAT+CTAT)$$

Fout=f0 when a=b, means the coefficients for PTAT and CTAT need to be adjusted to be equal.

Figure 3:
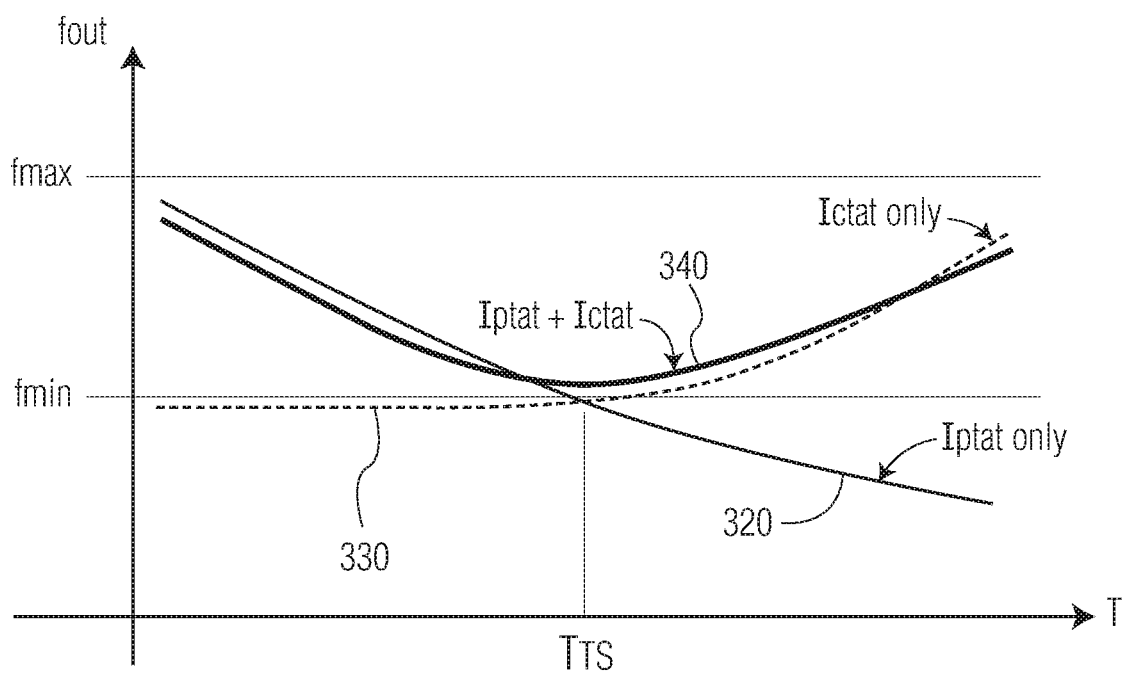
FIG. 3 illustrates Fout versus Ictat, Iptat and Iptat+Ictat for implemented FRO in accordance with example embodiments described herein.

FIG. 3 illustrates Fout versus Ictat, Iptat and Iptat+Ictat for an implemented FRO in accordance with example embodiments described herein. The DC level of Iptat+Ictat has been moved for a better comparison. FIG. 3 illustrates a real PTAT current 320, a CTAT current 330 and a summation 340 of two in the implemented FRO. The summation 340 uses a normalized value of the PTAT current 320. Fout of the summed current 340 may stay between fmin and fmax, meaning that fmax−fmin<Δ.

Instead of applying CTAT current 330 for all temperature ranges, a limited range of temperature may be chosen (as illustrated in FIG. 3 in which T>$T_{TS}$. This keeps the frequency within the required temperature range.

Based on FIG. 3, for PTAT current 320, $$Fout=f0-a1*T+a2*T^2.$$

$$Fout=f0,T<T_{TS}, \text{ and}$$

$$Fout=f0+b*T,T>T_{TS}.$$

For the combined current PTAT+CTAT 340, $$Fout=f0-a1*T,T<T_{TS}, \text{ and}$$

$$Fout=f0+(b-a1)*T+a2*T^2,T<T_{TS}.$$

To stay within the expected accuracy, considering fmax−fmin<Δ;

$$a1*T_{TS}<\Delta, \text{ and}$$

$$b*T_{TS}+a2*T_{TS}^2<\Delta.$$

A temperature range $T_{TS}$ may be selected based on a simulation or other circuit analysis to achieve an optimized point. This may be a different point for different technologies and different CCO architectures. $T_{TS}$ may be roughly 65° C. for a CCO 100 in accordance with example embodiments described herein. In such example embodiments, the temperature sensor 180 may play a role if when temperatures are higher than 65° C.

The temperature sensor 180 may be designed to sense ambient temperature, when ambient temperatures reach 65° C., 85° C., 105° C. or 115° C., the temperature sensor 180 may enable a secondary current DAC.

A secondary current DAC may be designed to compensate for excessive frequency degradation at elevated temperatures.

Figure 4:
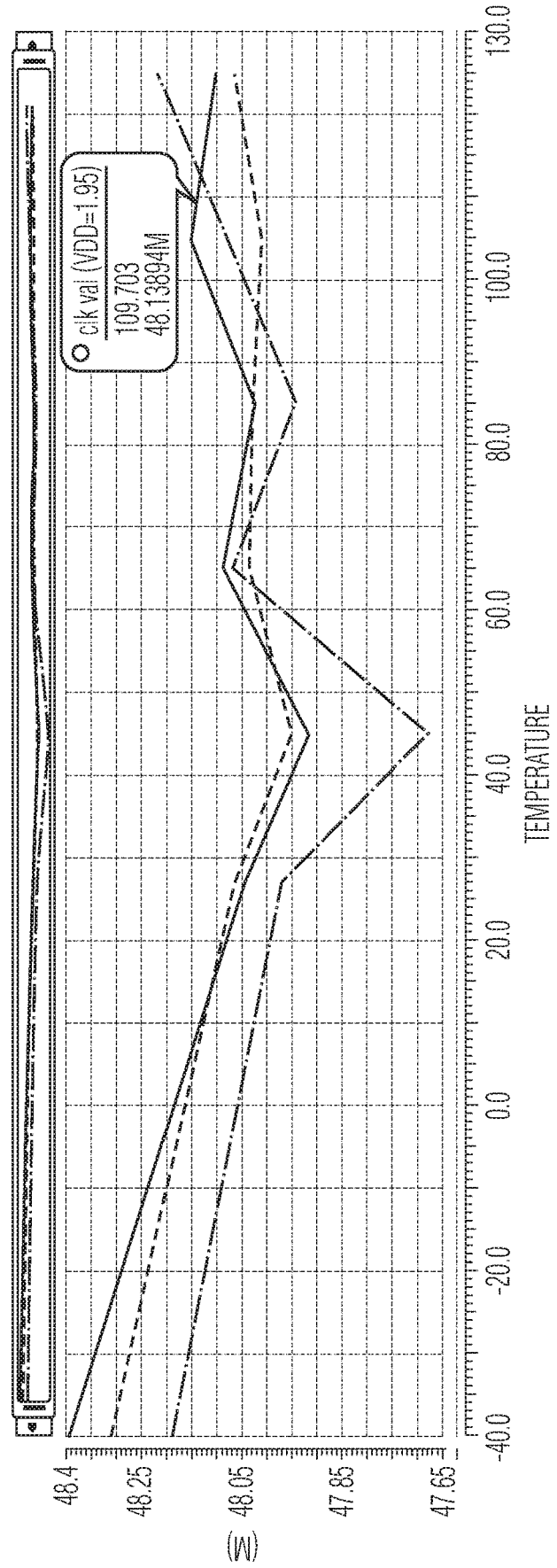
FIG. 4 illustrates simulated FRO frequency versus temperature in accordance with example embodiments described herein.

FIG. 4 illustrates simulated FRO frequency versus temperature in accordance with FIG. 3, for the actual circuit. FIG. 4 includes the non-idealities including trimming effect.

Figure 5:
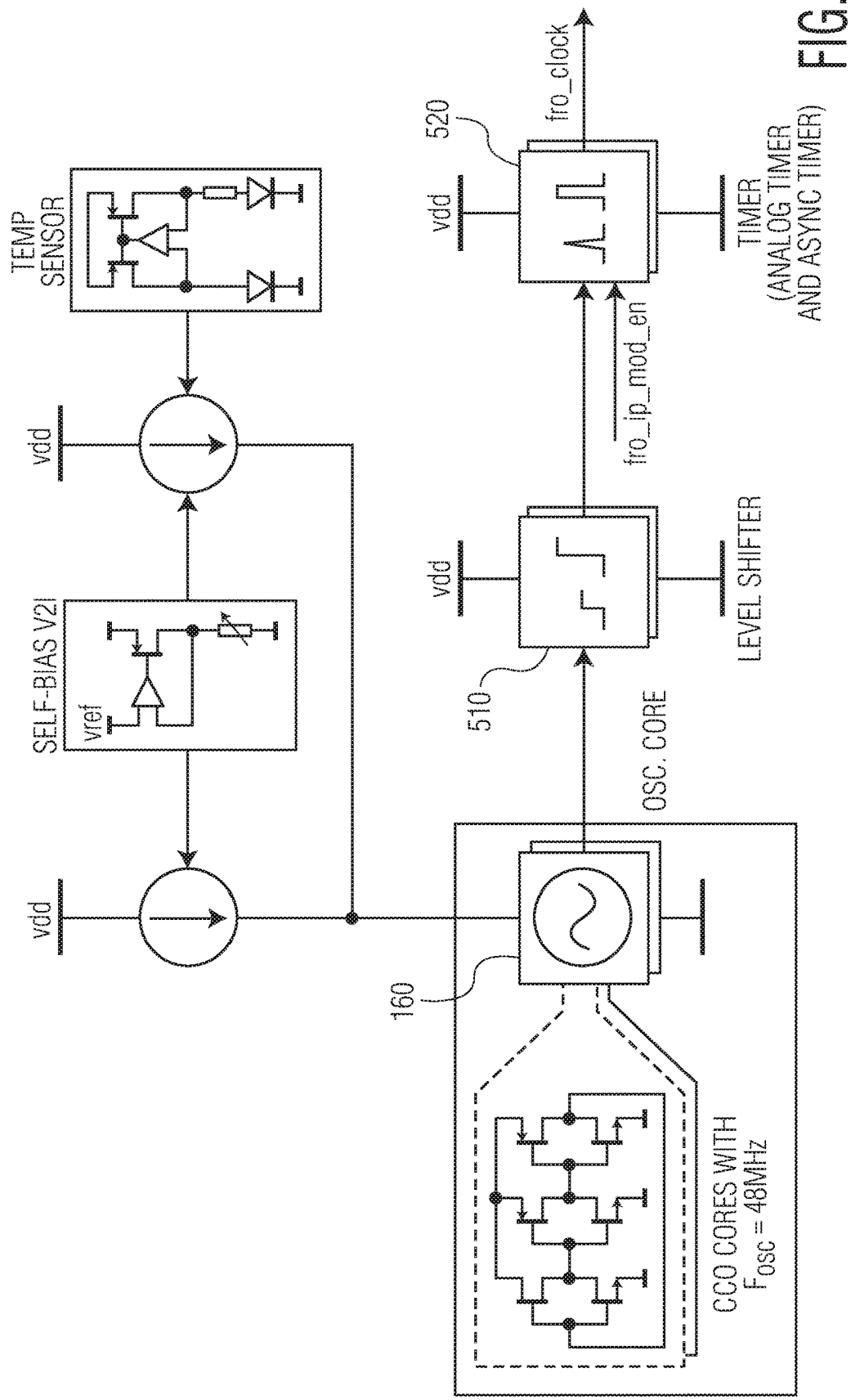
FIG. 5 illustrates a block diagram of an example embodiment described herein.

FIG. 5 illustrates a block diagram of an example embodiment described herein. FIG. 5 illustrates a FRO system 500 in combination with elements illustrated in FIG. 1. A level shifter 510 may rectify an output waveform from the shift up output swing of ring oscillator 160 from below 1 volt to rail to rail level which is necessary for digital, and an analog timer 520 may be added to avoid a glitchy clock feeding into the digital level shifter 510.

The temperature compensated CCO may be utilized to provide an accurate digital clock in applications where high clock accuracy is desired. For example, clocks in the UART standard may use the design of example embodiments.

Although the various example embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A temperature compensated current controlled oscillator (CCO), the CCO comprising:
   a first current generator configured to produce a proportional to absolute temperature (PTAT) current based upon a trim signal;
   a temperature sensor configured to produce a temperature measurement;
   a second current generator configured to produce a complementary to absolute temperature (CTAT) current based upon the temperature measurement, wherein the CTAT current is only produced when the temperature measurement is above $T_{ts}$ and $T_{ts}$ is selected based on a simulation or other circuit analysis to achieve an optimized point; and
   a ring oscillator configured to receive the PTAT current and the CTAT current and to produce a frequency signal based upon the PTAT current and the CTAT current, wherein the PTAT current and the CTAT current are based upon different numbers of bits.

2. The CCO of claim 1, wherein the first current generator further comprises:
   a digital to analog converter (DAC) configured to receive the trim signal and to produce an analog control signal.

3. The CCO of claim 2, wherein the first current generator further comprises:
   a current source controlled by the analog control signal.

4. The CCO of claim 1, wherein the second current generator further comprises:
   an analog to digital converter (ADC) configured to receive the temperature measurement signal and to produce a digital temperature control signal.

5. The CCO of claim 4, wherein the second current generator further comprises:
   a current source controlled by the digital temperature control signal.

6. The CCO of claim 1, further comprising:
   a plurality of inverters configured to produce an oscillating frequency.

7. The CCO of claim 1, wherein the first current generator is configured to receive a bias signal from a bias generator.

8. The CCO of claim 7, wherein the first current generator and the second current generator are configured to share the bias signal from the bias generator.

9. A method of producing a frequency signal using a temperature compensated current controlled oscillator (CCO), the method comprising:
   producing, by a first current generator, a proportional to absolute temperature (PTAT) current based upon a trim signal;
   producing, by a temperature sensor, a temperature measurement;
   producing, by a second current generator, a complementary to absolute temperature (CTAT) current based upon a temperature measurement, wherein the CTAT current is only produced when the temperature measurement is above $T_{ts}$ and $T_{ts}$ is selected based on a simulation or other circuit analysis to achieve an optimized point;
   receiving, by a ring oscillator, the PTAT current and the CTAT current, wherein the PTAT current and the CTAT current are based upon different numbers of bits; and
   producing, by the ring oscillator, a frequency signal based upon the PTAT current and the CTAT current.

10. The method of claim 9, further comprising:
    receiving, by a digital to analog converter (DAC), the trim signal and producing an analog control signal.

11. The method of claim 10, wherein the first current generator further comprises a current source controlled by the analog control signal.

12. The method of claim 9, further comprising:
receiving, by an analog to digital converter (ADC), the temperature measurement signal; and
producing, by the ADC, a digital temperature control signal.

13. The method of claim 12, further comprising:
controlling, in the second current generator, a current source controlled by the digital temperature control signal.

14. The method of claim 9, further comprising:
producing, with a plurality of inverters, an oscillating frequency.

* * * * *